(12) United States Patent
Robinson et al.

(10) Patent No.: US 10,921,716 B1
(45) Date of Patent: Feb. 16, 2021

(54) LITHOGRAPHIC DOSE CHARACTERIZATION

(71) Applicant: International Business Machines Corporation, Armonk, NY (US)

(72) Inventors: Christopher Robinson, Hyde Park, NY (US); Daniel Corliss, Waterford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/595,862

(22) Filed: Oct. 8, 2019

(51) Int. Cl.
*G03F 7/20* (2006.01)
*G03F 7/32* (2006.01)
*G03F 7/38* (2006.01)

(52) U.S. Cl.
CPC ........ *G03F 7/70558* (2013.01); *G03F 7/2004* (2013.01); *G03F 7/322* (2013.01); *G03F 7/38* (2013.01); *G03F 7/70625* (2013.01)

(58) Field of Classification Search
CPC .......... G03F 7/70558; G03F 7/70625
See application file for complete search history.

(56) References Cited

U.S. PATENT DOCUMENTS

| | | | |
|---|---|---|---|
| 6,145,118 | A | 11/2000 | Tomita |
| 7,179,571 | B2 | 2/2007 | Hinsberg, III et al. |
| 7,511,290 | B2 | 3/2009 | Suzuki et al. |
| 9,952,517 | B2 | 4/2018 | Verma et al. |
| 9,964,853 | B2 | 5/2018 | Vanoppen et al. |
| 10,274,836 | B2 | 4/2019 | Corliss |
| 2009/0032739 | A1 | 2/2009 | Kawase |
| 2018/0204707 | A1 | 7/2018 | Saib et al. |
| 2018/0259858 | A1 | 9/2018 | Chen et al. |
| 2018/0373164 | A1* | 12/2018 | Corliss ................ G03F 7/70558 |
| 2018/0373165 | A1 | 12/2018 | Corliss et al. |

FOREIGN PATENT DOCUMENTS

EP 3144955 A1 3/2017

OTHER PUBLICATIONS

C. Robinson, et. al., "Characterization and control of EUV scanner dose uniformity and stability", Proc. SPIE 10583 (2018), 9 pages.

* cited by examiner

*Primary Examiner* — Michelle M Iacoletti
(74) *Attorney, Agent, or Firm* — Cantor Colburn LLP; Abdy Raissinia

(57) ABSTRACT

Methods for determining unintentional exposure dose such as flare or out-of-band radiation of a lithography tool are provided. The methods generally include performing a series of open frame exposures with the lithography tool on a substrate having a photoresist therein to produce a primary array of controlled exposure dose blocks in the photoresist. Secondary exposure blocks are embedded within the primary array. The resultant open frame images are scanned with oblique light and the light scattered from the substrate surface captured. A haze map is created from a background signal of the captured scattered light data and converted to a graphical image file. Analyzing the graphical image file can be used to correlate any localized changes in the effective dose of the primary exposure array to the impact of secondary exposure blocks to characterize flare or out-of-band radiation associated with the exposure dose.

20 Claims, 10 Drawing Sheets

LITHOGRAPHIC DOSE CHARACTERIZATION

BACKGROUND

The present invention generally relates to the field of lithography. More specifically, embodiments of the present invention generally relate to the characterization of flare and/or out-of-band radiation contributions to exposure dose.

Lithography is a process used to transcribe a pattern, such as an integrated circuit pattern, or the like, onto a substrate. Lithography includes an exposure process in which a layer of resist (also known as photoresist) on a substrate is exposed to radiation that could be electrons, ions, soft x-ray (i.e., extreme ultraviolet radiation, "EUV") photons or optical photons modulated by a patterned mask. The photoresist is then developed to remove the exposed portion thereof (in the case of a positive photoresist) or non-exposed portion thereof (in the case of a negative photoresist), thereby forming a photoresist pattern. Then, a layer of material lying under the photoresist pattern is etched using the photoresist pattern as a mask. As a result, a pattern corresponding to the pattern of the mask is transcribed onto the substrate. The pattern can be used to create integrated circuit structures.

The dose and intensity of the exposure radiation should be controlled to be uniform during the exposure process. To this end, feedback relevant to the exposure radiation can be evaluated to determine the consistency and uniformity of the lithography process. In this respect, it becomes desirable to accurately characterize the exposure energy being delivered to the substrate. Control of the resist post-exposure bake and develop conditions are also important to ensure consistent dose response.

SUMMARY

Embodiments of the present invention are generally directed to methods for determining unintentional exposure dose delivered by a lithography tool. A non-limiting example of the method includes performing a series of open frame exposures with the lithography tool on a substrate having a photoresist therein to produce a primary array of controlled exposure dose blocks in photoresist. One or more secondary exposure blocks of an alternative dosage or alternative dosages are embedded in the primary array. The resultant open frame images are scanned with oblique light and the light scattered from the substrate surface is captured using an oblique light inspection device. A haze map is created from a background signal of the captured scattered light data and is converted to a graphical image file. The graphical image file is analyzed, wherein the graphical image file is related to the effective dose delivered by the lithography scanner and process track. Any localized changes in the primary exposure array are correlated to the impact of secondary exposure blocks, wherein the localized changes characterize flare or out-of-band radiation contributed to the exposure dose.

In one or more embodiments, a non-limiting example of the method for determining unintentional exposure dose associated with flare delivered by a lithography tool includes performing a series of open frame exposures with the lithography tool on a substrate having a photoresist thereon at equal exposure doses to produce a primary array of equal exposure dose blocks in the photoresist. One or more secondary exposure blocks of an exposure dose greater than the equal exposure doses used to produce the primary array is embedded therein, wherein the open frame exposures in the primary array are immediately adjacent to the secondary exposure blocks. Dose-gray scale calibration exposures of the photoresist are performed at incrementally increasing exposure doses. The resultant open frame images are scanned with oblique light and the light scattered from the substrate surface captured using an oblique light inspection device. A haze map is created from a background signal of the captured scattered light data and converted to a graphical image file. The graphical image file is analyzed, wherein the graphical image file is related to the effective dose provided by the lithography scanner and process track. Any localized changes in the exposure dose blocks of the primary array immediately adjacent to the secondary blocks are correlated utilizing the dose-gray scale calibration to characterize the flare associated with the lithography tool.

In one or more embodiments, a non-limiting example of the method for determining unintentional exposure dose associated with out-of-band radiation delivered by a lithography tool includes performing a series of open frame exposures with the lithography tool on a substrate having a photoresist thereon at incrementally increasing doses to produce a primary array of single exposed fields. One or more secondary exposure blocks are embedded within the primary array by exposing selected ones of the open frame exposures in the primary array a second time with an alternative mask reflector transmissive at a different wavelength to form twice exposed fields within the primary array. The resultant open frame images are scanned with oblique light and the out-of-band radiation from the substrate surface captured using an oblique light inspection device. A haze map is created from a background signal of the captured scattered light data and converted to a graphical image file. The graphical image file is analyzed, wherein the graphical image file is related to the effective dose of the lithography scanner and process track. A gray scale response of the twice exposed fields is compared to the single exposed fields to characterize the out-of-band radiation associated with the lithography tool.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
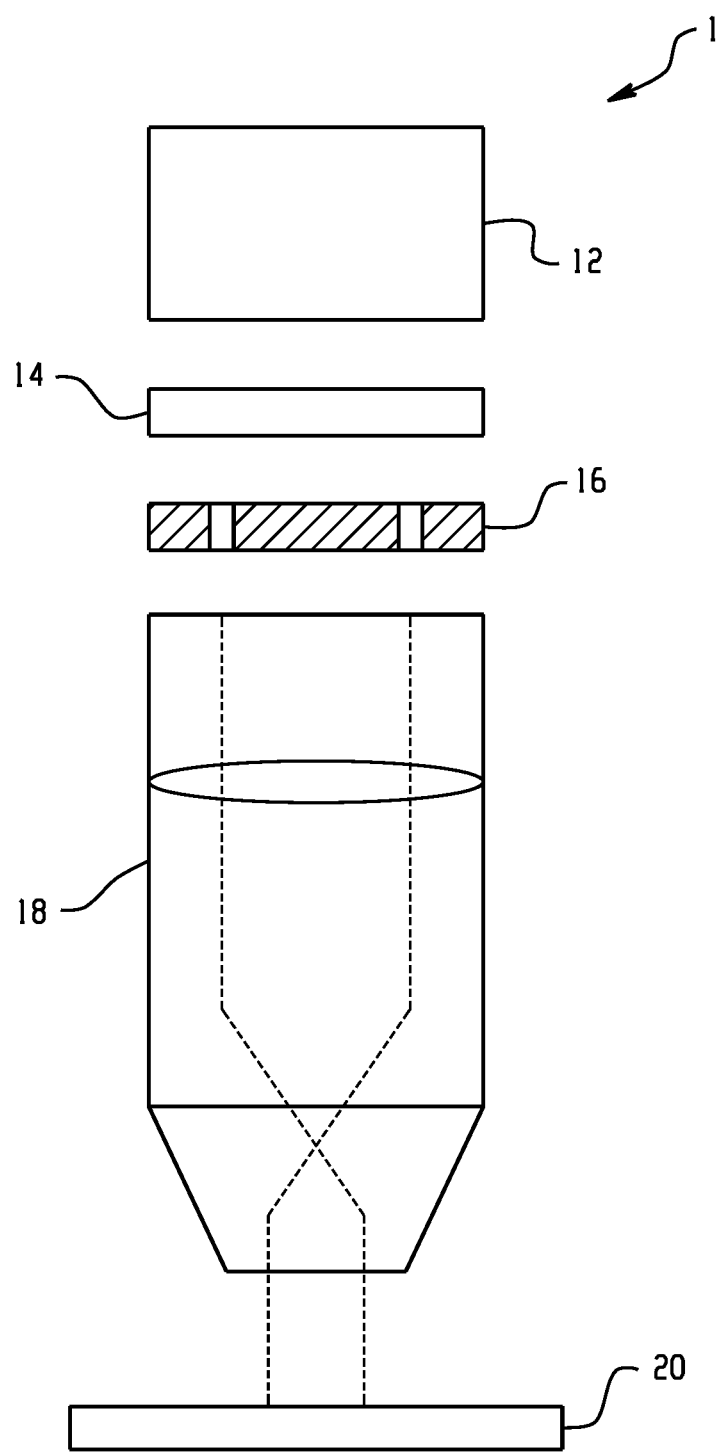
FIG. 1 is a pictorial representation of an exemplary scanner system capable of being utilized in connection with aspects of the invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting. In the drawings, like numbering represents like elements.

DETAILED DESCRIPTION

The present invention generally relates to characterization of a lithographic exposure dose. More particularly, the present invention relates to the characterization of the delivery of an unintended exposure to regions being exposed to the lithographic radiation. For example, and as will be described in greater detail below, flare, which is associated with scattered light or stray light contributions, and/or out-of-band radiation contributions can be characterized based on featureless measurement of the lithographic dose delivered by a scanner. Characterization of the lithographic effective dose and the unintended exposure associated with flare and out-of-band radiation generally includes a series of open frame exposures with the lithography tool on a substrate to produce a primary array of controlled exposure dose blocks in a photoresist layer and secondary exposure blocks of an alternative dosage or alternative dosages. After photoresist exposure and development, the resultant images are scanned with oblique light to generate a haze map, which is converted to a graphical image file to determine an effective dose of the lithographic tool. As used herein, the term "effective dose" refers to an exposure dose per unit volume of photoresist received at any given exposure site. This includes the intended dose for pattern transfer plus any unintended contributions from flare and/or out of band radiation attributed to the lithographic light source.

The graphical image file obtained in this manner is directly related to the effective dose of the lithographic tool and can be used to correlate any localized changes in effective dose of the primary exposure array relative to the secondary exposure blocks. For example, the brightness of the images are directly related to the effective dose and can be used to correlate any localized changes in effective dose of the primary exposure array relative to the secondary exposure blocks. Advantageously, high frequency spatial sensitivity and parallel measurement can occur with the flare or out-of-band radiation characterization of the lithographic effective dose such that any dosage errors associated with flare and/or the out-of-band radiation can be readily measured.

Various embodiments of the present invention will now be described with reference to the related drawings. Alternate embodiments of the present invention can be devised without departing from the scope of the invention. Various connections might be set forth between elements in the following description and in the drawings. These connections, unless specified otherwise, can be direct or indirect, and the present description is not intended to be limiting in this respect. Accordingly, a coupling of entities can refer to either a direct or an indirect connection.

The terminology used herein is for the purpose of describing particular embodiments of the present invention only and is not intended to be limiting. As used herein, the singular forms "a", "an", and "the" are intended to include the plural forms as well, unless the context clearly indicates otherwise. Furthermore, the use of the terms "a", "an", etc., do not e a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, or substrate is referred to as being "on" or "over", or "disposed on" another element, it can be directly on the other element or intervening elements can also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements can be present. In contrast, when an element is referred to as being "directly connected" or "directly coupled" to another element, there are no intervening elements present.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. The various steps in the manufacture of semiconductor devices and semiconductor-based integrated circuits are well-known and so, in the interest of brevity, many conventional steps will only be mentioned briefly herein or will be omitted entirely without providing the well-known process details.

Turning now to an overview of technologies that are more relevant to aspects of the invention, a general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures are unique. Thus, the unique combination of the operations described in connection with the fabrication of semiconductor devices utilize a variety of individually known physical and chemical processes performed on a semiconductor (e.g., silicon) substrate, some of which are described in the following immediately following paragraphs.

In general, the various processes used to form a microchip that will be packaged into an integrated circuit fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions or even billions of transistors can be built and wired together to form the complex circuitry of a modern microelectronic device.

An important aspect to the above-described fabrication processes is semiconductor lithography, i.e., the formation of three-dimensional relief images or patterns on the semiconductor substrate for subsequent transfer of the pattern to the substrate. In semiconductor lithography, the patterns are placed on a radiation sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final semiconductor device.

Various types of exposure apparatuses can be used in lithography. For example, a scanner-type of exposure apparatus of a lithography system employs an exposure slit which defines the radiation contributing to the exposure process, and a setup in which the mask and a stage supporting the substrate are moved relative to each other so that the resist is scanned by the exposure radiation. In general, the intensity of the exposure radiation in the slit should be uniform and the delivered dose controlled if the exposure process is to be carried out effectively. Other exposure apparatuses also can be used. Likewise, it is important that the post-exposure bake and develop processes are consistent and uniform since these processes also influence the effective substrate dose.

A sensor integrated with the scanner-type of exposure apparatus can be used to measure scattered light (i.e., flare). For extensive characterization, such a sensor can take tens of minutes to measure the energy distribution of radiation. The exposure system is not operated during this time. That is, there is down time in the exposure process, performed by a scanner-type of exposure apparatus, in which the exposure radiation is controlled based on measurements obtained using a sensor. Out-of-band radiation measurements are accomplished using open frame exposures, but the current state-of-the-art relies on slower, more conventional evaluation techniques. Furthermore, the in-band to out-of-band response is compared directly, meaning that in order to see a 1% effect, many increments of over dosage (up to 100× dose) are required. By superimposing the in-band and out-of-band exposures and leveraging the sensitivity of the haze analysis method described herein, the comparison can be accomplished with far fewer exposures and without significant overdosing. These factors enable a much faster exposure sequence which reduces the impact to productive scanner time.

Examples of an alternative technique for quantifying the dose distribution of scattered radiation (flare) in a scanner-type of exposure apparatus (referred to simply as a "scanner" hereinafter), and a lithography method making use of such a technique, will now be described in detail with reference to the attached drawings.

Referring first to FIG. 1, an exemplary lithography tool is a scanner 10 including a condenser lens 12 for condensing radiation emitted from a radiation source (not illustrated), a slit 14 defining the radiation condensed by the condenser lens 12, a projection lens system 18 for reducing the image of the radiation transmitted by the mask 16 and projecting the reduced image onto a substrate, and a wafer stage 20 provided under the projection lens system 18 for supporting the substrate (not shown). The scanner 10 can also be referred to as a stepper or a scanning stepper.

Figure 2:
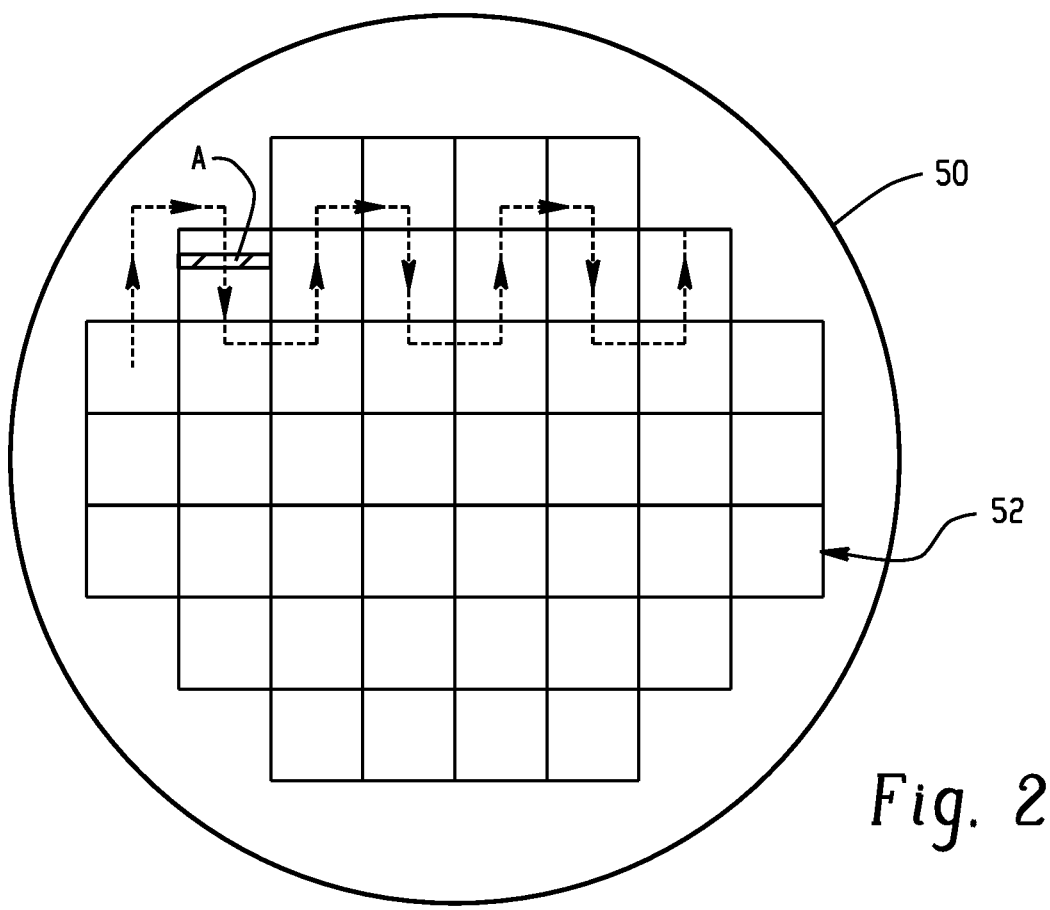
FIG. 2 is a pictorial representation of a substrate for use in the exemplary scanner system.

With reference to both FIGS. 1 and 2, a method of exposing a substrate 50, using the lithography tool 10, e.g., a scanner, will now be described. FIG. 2 is a pictorial representation of a substrate 50 that is placed on the wager stage 20 in the exemplary scanner system shown in FIG. 1. The substrate 50 is divided into a plurality of regions 52 referred to as "fields" and the fields 52 of the substrate 50 are sequentially exposed by the exposure radiation provided by the lithographic tool. In each field 52, an area A (exposure slit) is projected onto the substrate 50 and the substrate 50 is moved relative to the lithographic tool 10 so that the exposure slit A is moved along the direction designated by the arrows in FIG. 2. The lithography tool 10 such as the scanner above, or optionally, a stepper as in other embodiments, is arranged to perform a series of open frame exposures using a featureless mask within each of the fields on the substrate 50 to produce a set of controlled exposure dose blocks in a photoresist layer provided on the substrate 50.

In one or more embodiments, the exposure dosage is just below E0, which is generally defined as the exposure dose that enables full dissolution of the photoresist after a post exposure bake step and development in a suitable developer for the photoresist. In this manner, response sensitivity of the photoresist exposed to various doses just below E0 can be accentuated with the haze analysis method to provide full field inspection capability with maximized sensitivity and minimized characterization time. Subsequent analysis can provide measurement of any unintended lithographic exposure dose due to flare and/or out-of-band radiation. Moreover, it should be apparent that the methodology is based on featureless measurement of the lithographic exposure dosage delivered by the scanner 10. The dose characterization is thus continuous and is not limited by the placement of measurement features or measurement throughput concerns in the event a mask including features were used.

More specifically, in one or more embodiments of the present invention, length of the exposure slit A has the same dimension as each field 52 in a given direction (the direction of the X-axis in FIG. 2). As the exposure slit A in a field is exposed, the substrate 50 is moved relative to the exposure system 10 in the width-wise direction of the exposure slit A, i.e., along the direction of the Y-axis continuously through the length of field 52 and the exposure process is then performed again with respect to the next exposure field 52. After each field 52 is exposed, the substrate 50 can be moved in the direction of the X-axis relative to the exposure system 10 to locate the exposure slit in the adjacent field 52, and then the adjacent field region is exposed as described above by moving the exposure slit A along the direction of the Y-axis. Thus, the substrate 50 is moved in one direction along the Y-axis while a first field 52 is exposed, and the substrate 50 can be moved in the other direction along the Y-axis (i.e., in the opposite direction) while the next field 52 is exposed.

In this manner, the photoresist layer formed over an entire region of the substrate 50 constituted by the fields 52 is exposed. Then, as mentioned above, the photoresist layer is baked and developed to thereby form a photoresist pattern.

The exposure radiation defined by the slit 14 of the lithographic tool 10 exposes the layer of photoresist over each exposure field 52. The energy distribution of the exposure radiation along the slit 14, that is, at each location along the length of the slit 14, should be uniform and consistent if the resist pattern to be formed by the exposure process is to have uniform characteristics. However, in practice unintended flare, i.e., scattered or stray light, and/or out-of-band radiation, from the lithographic tool can occur, which can impact dose uniformity within a given exposure and the dose consistency over time. In accordance with one or more embodiments, instead of characterizing lithographic dose variations using a finite array of measurable critical dimension features, the methods described herein leverage the response sensitivity of photoresist films exposed to doses just below E0, optimized exposure layouts, and a full field inspection capability to maximize spatial sensitivity and minimize characterization time.

Figure 3:
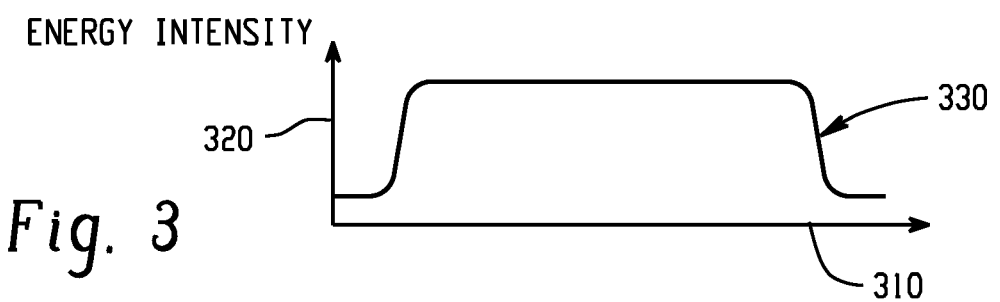
FIG. 3 is a graph illustrating a non-ideal energy distribution of exposure radiation of the exemplary system.
Figure 4:
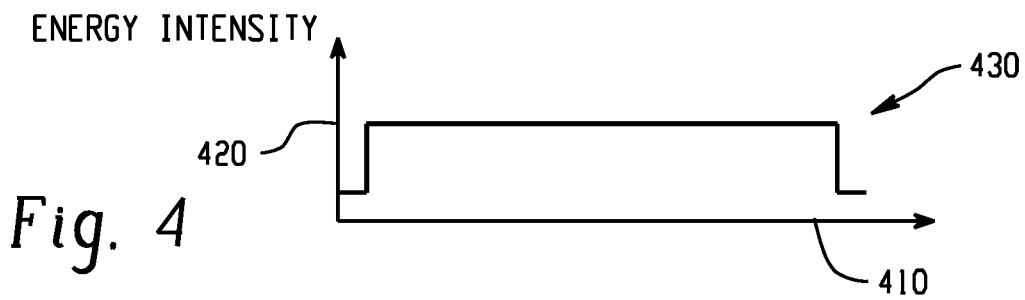
FIG. 4 is a graph illustrating an ideal energy distribution of exposure radiation of the exemplary system.

FIGS. 3 and 4 show energy distributions of exposure radiation along the slit 14 (as shown in FIG. 1). In FIGS. 3 and 4, the x-axis 310, 410 represents the distance from the starting point, y-axis 320, 420 represents the radiation intensity, and graphs 330, 430 are graphical representations of radiation intensity across the exposure slit 14. Graph 330 is indicative of non-ideal energy distribution including flare or out-of-band radiation whereas graph 430 shows an ideal energy distribution. In the case in which the lithographic tool 10 is producing exposure radiation having a non-ideal energy distribution 330 as illustrated in FIG. 3, the magnitudes of the unintended energies are characterized to enable performance tracking and potentially dose compensation schemes such as mask optical proximity correction adjustments.

According to an aspect of the inventive concept, relationships between the intensity of the exposure radiation, the oblique light scattered from the residual resist in the open frame exposure blocks after the developing process, and color characteristics of the haze map graphical image pixels, are determined and then are subsequently used to determine or "measure" the distribution of the intensity of the exposure radiation defining the slit 14.

When a layer of a positive photoresist (referred to simply as a "photoresist layer" hereinafter) is exposed using a scanner-type of exposure apparatus, the exposed portion of the photoresist layer undergoes a reaction which makes the exposed portion more soluble in a developing solution. In some cases, the exposure is followed by a bake process to accelerate the exposure reaction. Thus, the exposed portion of the photoresist layer can be selectively removed by performing a developing process in which the exposed photoresist layer is wetted by the developing solution. In this respect, the degree of dissolution depends on the dosage (integrated energy) of the exposure radiation. Furthermore, when a layer of photoresist is developed, the thickness of a layer of exposed photoresist decreases. If the delivered radiation dose is less than that required for full dissolution, the residual thickness, roughness, and other surface properties depend on the dosage of the exposure radiation.

More specifically, complete photoresist dissolution does not occur when the intensity of the exposure radiation has a relatively low value. In this case, the thickness of the photoresist layer is hardly affected by the developing process. On the other hand, dissolution occurs throughout the thickness of the layer of photoresist when the intensity of the exposure radiation has a certain value, E0, known as the dose-to-clear. E0 dosage results in full dissolution and removal of the photoresist film. For radiation doses above and beyond E0, the photoresist is also completely removed, and haze map changes are small. Thin residual film properties at exposure doses slightly below the E0 dose can provide relatively strong haze response and a very sensitive metric of radiation dose variations. In the present invention, the exposure dose is set to be below the E0 dosage such that some photoresist remains on the substrate within a given field subsequent to exposure and development.

A common method of testing the dose delivery of lithography systems is the use of a scanning electron microscope (SEM) to measure the feature size of developed critical dimension (CD) images. An alternative characterization practice employed open frame exposures (exposures without a mask pattern) performed on a wafer. The developed open frame images were evaluated qualitatively via optical microscopy or quantitatively by sampling residual resist thicknesses. There are a variety of shortcomings of such methodologies. CD SEM measurements can be limited by feature sampling density and measurement throughput and are affected by non-dose related factors such as image defocus. In addition, optical microscopic evaluation of open frame exposures is subjective and does not provide enough sensitivity. Film thickness metrology of open frame exposures provides more objective results, but the spatial frequency of the data collected is limited by the discrete nature of the sampling and the low throughput of the measurements.

Turning now to an overview of the aspects of the invention, one or more embodiments of the invention address the above-described shortcomings of the prior art by providing a quick and accurate method and system of analyzing unintended dosage aspects of the lithography associated with flare and/or out-of-band radiation. The shortcomings of the prior art are overcome by graphically analyzing oblique light scattered during a surface scan of a wafer with open frame images. This technique provides high sensitivity, while allowing an analysis of a large area of the wafer. An analysis of high-spatial frequency surface inspection haze data derived from the scattered light background "noise" signal can turn the open frame test into a very powerful quantitative dose assessment technique.

Figure 5:
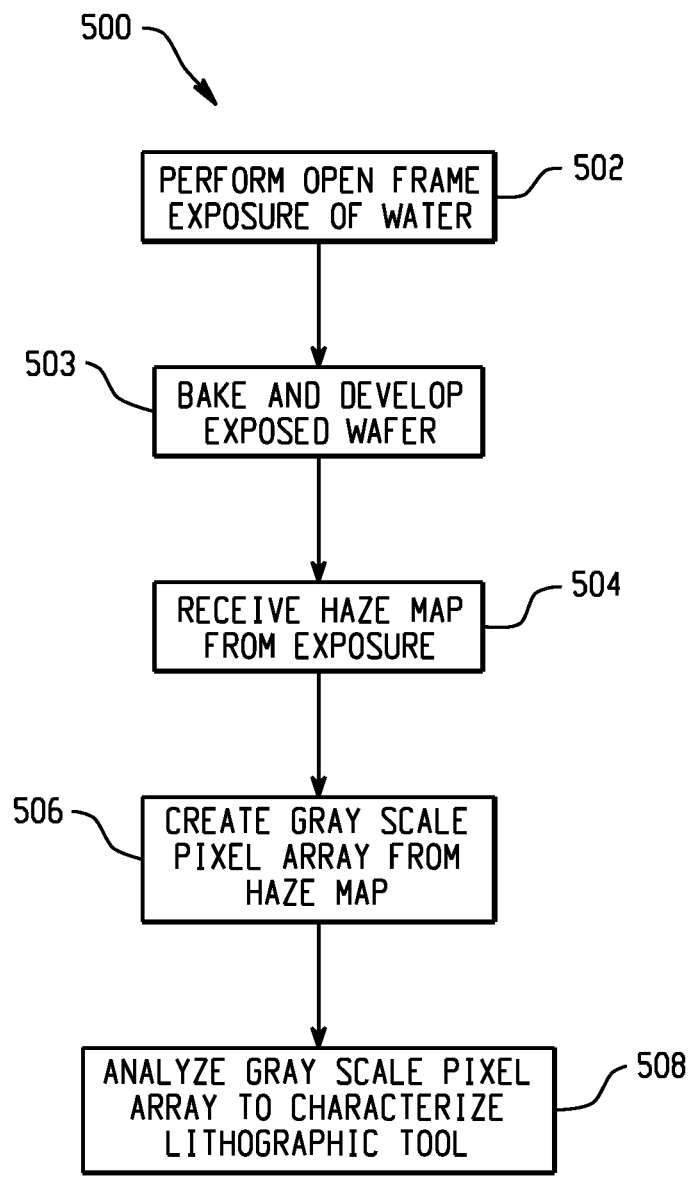
FIG. 5 is a flow diagram illustrating a method for effective dose characterization in the exemplary scanner system according to one or more embodiments of the invention.

Turning now to a more detailed description of aspects of the present invention, a flowchart illustrating method 500 is presented in FIG. 5. Method 500 is merely exemplary and is not limited to the embodiments of the present invention presented herein. Method 500 can be employed in many different embodiments or examples of the present invention not specifically depicted or described herein. In some embodiments, the procedures, processes, and/or activities of method 500 can be performed in the order presented. In other embodiments of the present invention, one or more of the procedures, processes, and/or activities of method 500 can be combined or skipped. In one or more embodiments of the present invention, method 500 is performed by a processor as it is executing instructions and controlling an exemplary lithographic tool.

An open frame exposure is performed on photoresist layer formed on a wafer or substrate (block 502). The open frame wafer exposure is a traditional exposure done in a manner now known or developed in the future. The layer of photoresist can be placed on the wafer prior to the open frame wafer exposure. No mask pattern is used when making the open frame wafer exposure, i.e., the mask is featureless.

The full wafer exposure can produce dose dependent graded thickness blocks after photoresist post-exposure bake and develop steps (block 503). The wafer can be divided into multiple fields, row, or columns, as described in further detail below, the pattern of which will generally depend on whether unintended dose characterization is of flare or out-of-band radiation. The developed images are scanned in a defect inspection tool that detects oblique light scattered from the substrate surface. The signal background levels or the noise detected during the defect inspection of the processed open frame wafer is sometimes referred to as a haze data. The "haze map" (block 504) collects this noise data from a surface scan of the entirety of the wafer.

The haze map is converted to a grayscale pixel array (block 506). This can be performed in one of a variety of different manners. In one or more embodiments of the present invention, the gray scale pixel array can be output directly by the defect inspection tool. In one or more embodiments of the present invention, a high-resolution graphical image file of the wafer is output which contains the gray scale pixel details. In one or more embodiments of the present invention, multiple high-resolution images of the wafer are output by the defect inspection tool. In one or more embodiments of the present invention, the images are grayscale images.

In the image(s), the surface characteristics of a particular field (such as field 52 shown in FIG. 2) are represented in the pixel array as shades of gray. The brightness of the image is related to the residual resist film properties (e.g. thickness, roughness, surface energy) at that point and thus is related to the energy received at that point. It should also be understood that color images can be created instead of grayscale images. In such a manner, the haze map is quickly transformed from into a graphical image that can then be analyzed using any one of a number of different graphic tools.

The pixel array can then be analyzed using one of a variety of different techniques (block 508). Because the array is now a graphic file in one of a variety of different formats (for example, jpeg, png, gif, bmp, tiff, and the like), a variety of different manners can be used to perform an analysis of the graphic file. For example, analysis software such as MATLAB can be used to analyze the uniformity of the graphic file. The analysis can translate the graphic file into multiple two-dimensional graphs. Thereafter, the scanner energy consistency and uniformity within a field can be characterized. This enables better understanding of the scanner performance limitations and can be used to verify scanner optimization strategies.

Figure 6:
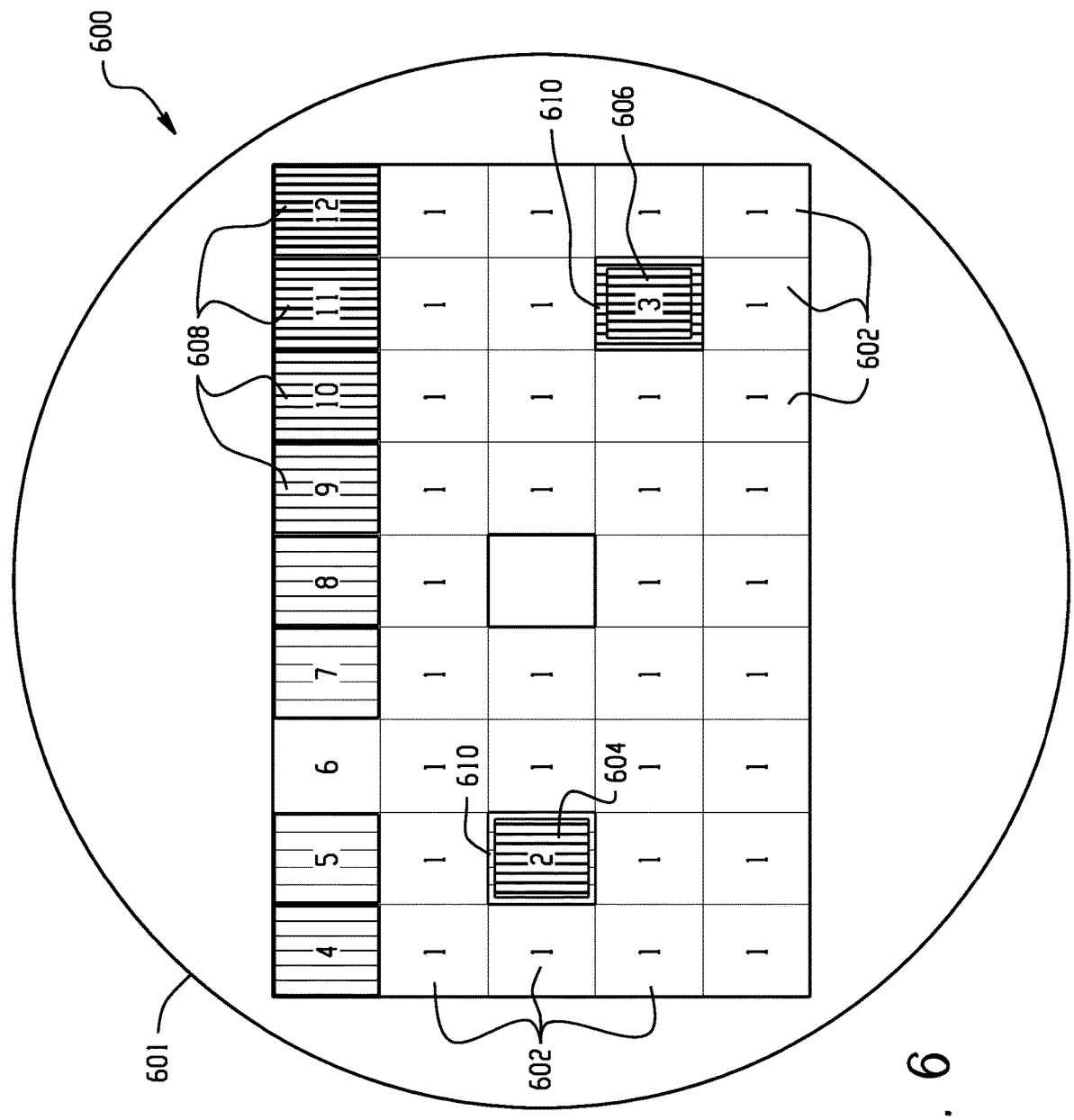
FIG. 6 depicts a wafer layout suitable for characterizing the flare dose provided by a lithography tool according to one or more embodiments of the invention.
Figure 7:
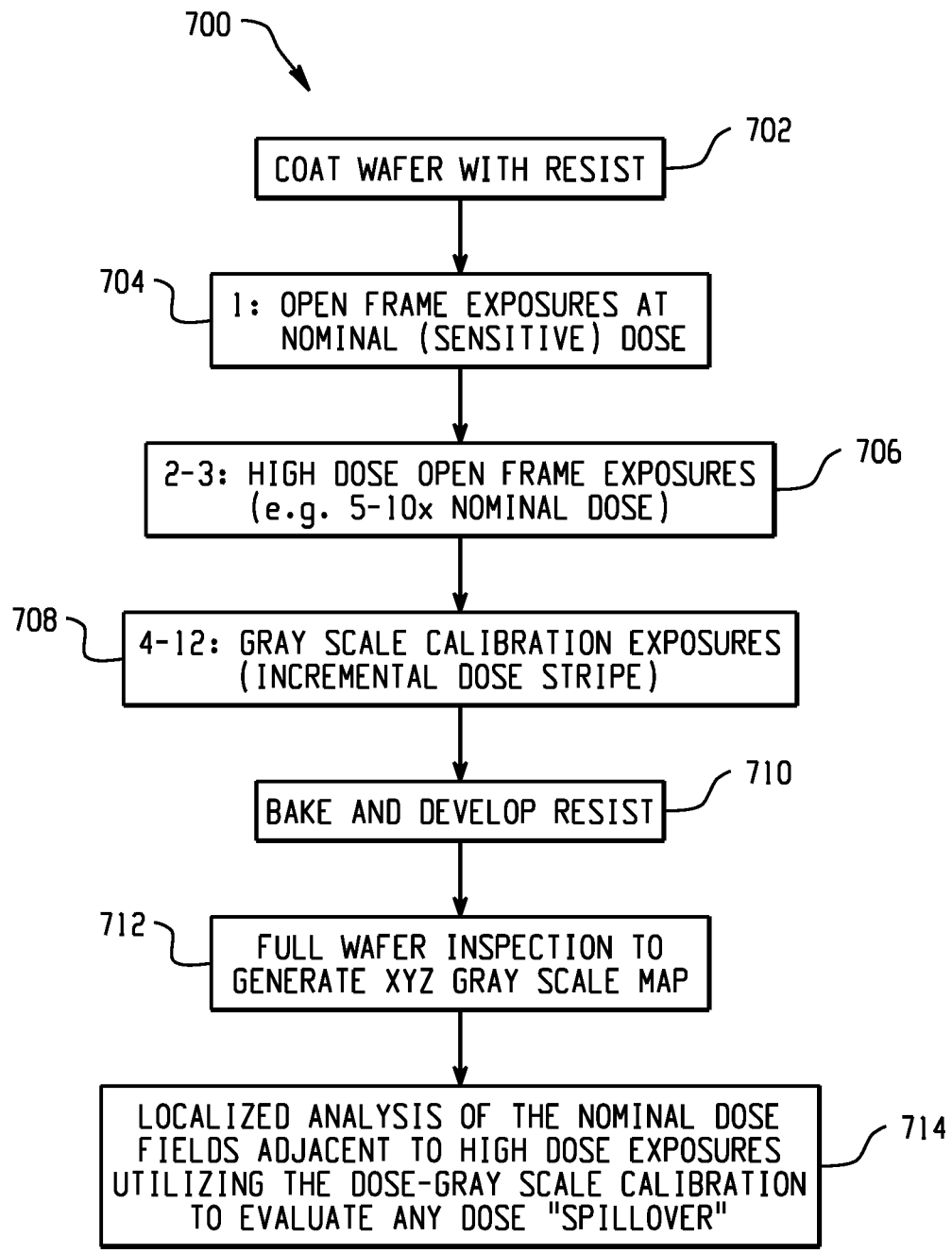
FIG. 7 is a flow diagram illustrating a method for characterizing flare in the exemplary scanner system according to one or more embodiments of the invention.

Turning now to a more detailed description of aspects of the present invention, FIGS. 6-7 illustrate an exemplary wafer layout and flow diagram for characterization of an unintended exposure dose of flare associated with an intended lithographic exposure dose.

In FIG. 6, there is depicted an exemplary wafer layout 600 for flare characterization. The wafer 601 can be divided into multiple fields, row, or columns, as described in further detail below, the pattern of which will generally depend on whether unintended dose characterization is of flare or out-of-band radiation. In the wafer layout for flare characterization, the layout includes a plurality of fields 602 exposed at a nominal dose below E0, fields 604 and 606 exposed at a multiple of the nominal dose, and a plurality of fields 608 corresponding to gray scale calibration exposures of incrementally increasing (or decreasing) doses.

The plurality of fields 602 at the nominal dosage below E0 surround each of fields 604 and 606 such that unintended dosage associated with flare is captured upon post exposure bake and development in the form of a halo 610 about each of the fields 604 and 606. The halo 610 extends into the immediately adjacent fields 602 and is representative of flare associated with the increased dosage utilized in fields 604, 606. The halo 610 in the immediately adjacent field 602 reduces the thickness of the photoresist relative to the thickness that remains after the nominal exposure. By way of example, the exposure dose for field 604 can be at 5 times the nominal dose used in fields 602 and the exposure dose for field 606 can be at 10 times the nominal does used in fields 602. However, it should be noted that fields 604, 606 can be at different multiples so long as the exposure dose is greater than the nominal dose used in fields 602. As expected, the halo 610 in the field exposed to the highest exposure, i.e., field 606, extends the most into the immediately adjacent fields 602 and is slightly darker relative to the halo 610 about field 604 since the exposure to the increased energy dose at the highest dose results in increased flare. In the event that flare was not present with the particular lithographic tool, a halo would not be present and the thickness within each field 602, would be uniform absent any other irregularity.

In FIG. 7, the method for flare characterization 700 is depicted in the flow diagram. The flow diagram is merely exemplary and is not limited to the embodiments of the present invention presented herein. Method 700 can be employed in many different embodiments or examples of the present invention not specifically depicted or described herein. In one or more embodiments, the procedures, processes, and/or activities of method 700 can be performed in the order presented. In one or more embodiments of the present invention, one or more of the procedures, processes, and/or activities of method 700 can be combined or skipped. In one or more embodiments of the present invention, method 700 is performed by a processor as it is executing instructions and controlling an exemplary scanner.

In the method for flare characterization, a layer of photoresist is first uniformly coated on the wafer (i.e., substrate) prior to an open frame wafer exposure (block 702). No mask pattern is used when making the open frame wafer exposure, i.e., the mask is featureless. The photoresist is not intended to be limited and is generally selected to be photosensitive to the wavelength of radiation used for the flare characterization.

In block 704, the open frame exposure is performed on the wafer at a nominal dose for fields 602, which are labeled 1 within each of the fields 602, which is set at below the clearing dose E0, i.e., a nominal exposure dose intended to remove only a portion of the photoresist. The open frame wafer exposure is a traditional exposure done in a manner now known or developed in the future.

In block 706, one or more high dose open frame exposures are then performed in selected fields, two of which are shown and designated by reference numerals 604 and 606 and are labeled 2, 3, within the respective field. The field(s), e.g., 604, 606, exposed to the high dose open exposure is positioned such that the nominal dose exposed fields 602 are immediately adjacent to the field exposed to the high dose. The exposure dose is greater than the nominal dose, and in one or more embodiments, exposure dose can be greater than the clearing dose E0. By way of example, field 604 can be exposed at an exposure dose five times the nominal dose used in the fields 602 and field 606 can be exposed at an exposure dose ten times the nominal dose. In this manner, flare extending into adjacent frames 1 from the high dose open frame exposures 2 and 3 can be characterized as will be described in greater detail below.

In block 708, gray scale calibration exposures 608, which are labeled 4-14 within each of the calibration exposure doses are performed using incremental exposure doses greater than, equal to, and/or less than the nominal dose). Although 11 incremental doses are shown, greater or lesser exposure doses can be used. Optionally, the gray scale calibration exposures can be made in the first row. However, it should be apparent that the gray scale exposures can be made anywhere within the frame matrix.

In block 710, the resulting exposures to the photoresist produce dose dependent graded thickness blocks after post-exposure bake and develop steps.

In block 712, the developed images are scanned in a defect inspection tool that detects oblique light scattered from the substrate surface. The signal background levels or the noise detected during the defect inspection of the processed open frame wafer is sometimes referred to as a haze data. The "haze map" collects this noise data from a surface scan inspection of the entirety of the wafer. The haze map is converted to a grayscale pixel array. This can be performed in one of a variety of different manners. In one or more embodiments of the present invention, the gray scale pixel array can be output directly by the defect inspection tool. In one or more embodiments of the present invention, a high-resolution graphical image file of the wafer is output which contains the gray scale pixel details. In one or more embodiments of the present invention, multiple high-resolution images of the wafer are output by the defect inspection tool. In one or more embodiments of the present invention, the images are grayscale images.

In the image(s), the surface characteristics of a particular field (such as field 602) are represented in the pixel array as shades of gray. The brightness of the image at a point is related to the residual photoresist film properties (e.g. thickness, roughness, surface energy) at that point and thus is related to the energy received. It should also be understood that color images can be created instead of grayscale images. In such a manner, the haze map is quickly transformed from into a graphical image that can then be analyzed using any one of a number of different graphic tools.

In block 714, the pixel array can then be analyzed using one of a variety of different techniques. Because the array is now a graphic file in one of a variety of different formats (for example, jpeg, png, gif, bmp, tiff, and the like), a variety of different manners can be used to perform an analysis of the graphic file. For example, analysis software such as MAT-LAB can be used to analyze the uniformity of the graphic file. Localized analysis of the nominal dose fields 602 immediately adjacent the high dose fields, e.g., 604, 606, utilizing the dose gray scale calibration can be used to evaluate any dose spillovers, which is directly related to flare. The analysis can translate the graphic file into multiple two-dimensional graphs. Thereafter, the scanner energy consistency and uniformity within a field can be characterized. This enables better understanding of the scanner performance limitations and can be used to verify scanner optimization strategies.

Figure 8:
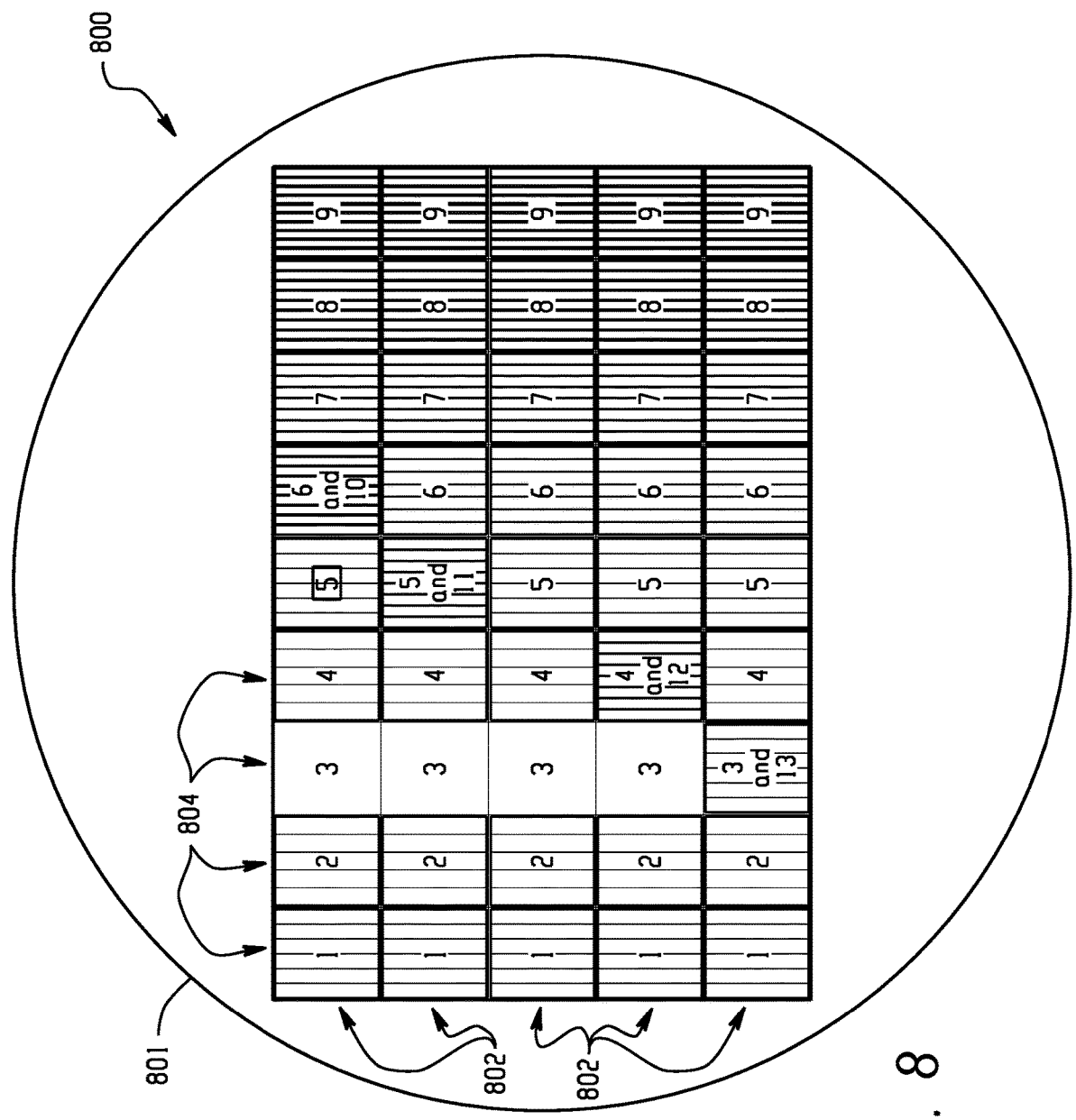
FIG. 8 depicts a wafer layout suitable for characterizing the out-of-band radiation produced by a lithography tool according to one or more embodiments of the invention.
Figure 9:
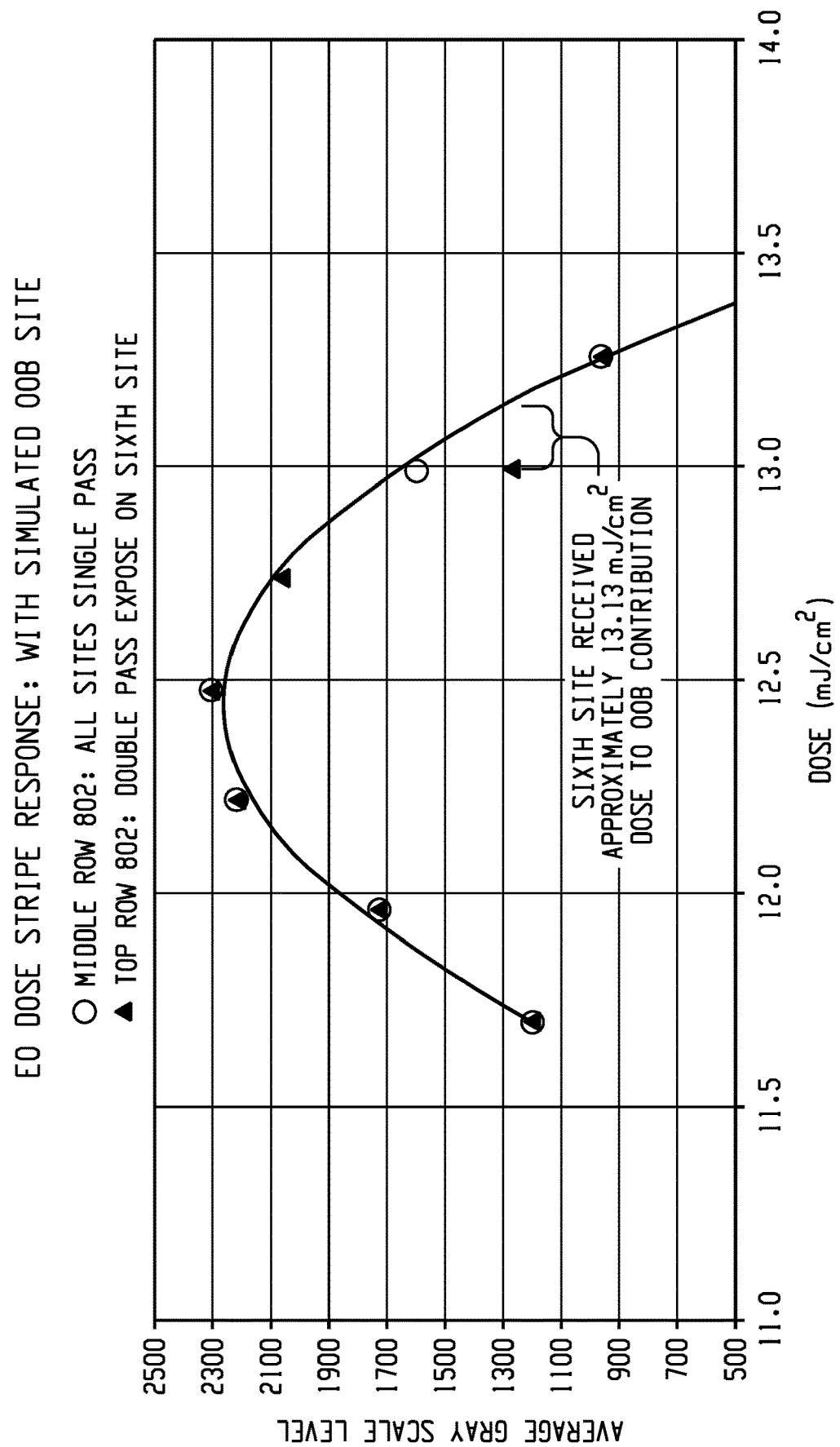
FIG. 9 graphically illustrates average gray scale level impact of a double pass exposure compared to a base line of incrementally increasing single pass exposures in accordance with one or more embodiments of the present invention.

FIGS. 8 and 9 illustrate an exemplary wafer layout 800 and flow diagram, respectively, for characterization of an unintended exposure dose associated with out-of-band radiation. Light sources for the lithographic tool typically emit light over a wide spectral range along with the desired wavelength. Out-of-band radiation generally refers to the lack of spectral purity associated with the light source. By way of example, EUV photoresists are often sensitive to both EUV radiation at a wavelength of 13.5 nm and out-of-band radiation because a fair amount of the EUV photoresists are based on materials originally designed for exposure at wavelengths of 193 nm and deep ultraviolet (DUV) having a wavelength of 248 nm. Some of the detrimental effects of out-of-band radiation within the lithography process can be seen in the form of photoresist film thickness loss, which in turn results in profile degradation.

Referring now to FIG. 8, the wafer layout 800 for out-of-band radiation characterization includes a wafer 801 divided into multiple fields, rows, or columns, as described in further detail below. The wafer layout 800 generally includes multiple rows with increasing exposure doses and columns at the same exposure dose at a particular wavelength using a particular featureless mask for the wavelength. In the wafer layout depicted in FIG. 8, there is a 9 (column) by 5 (row) array. The wafer layout 800 is not intended to be limited to the particular array of fields as shown as there can be more or less columns and/or more or less rows.

As shown, each row 802 in the array includes 9 fields of increasing exposure doses at a particular wavelength utilizing a featureless mask for the particular imaging wavelength, e.g., EUV wavelength of 13.5 nm, wherein the exposure doses are labeled 1-9 and provide a sensitive gray scale response that is generally indicated by changes in brightness associated with the particular exposure dose, wherein the brightness is indicative to thickness loss of the photoresist after post exposure bake and development. The same exposure dose is used within each column 804 in the wafer layout 800.

Additionally, a selected one of the fields within at least some of the rows is exposed on the scanner being tested a second time with an alternative mask that is reflective at a different wavelength of radiation, e.g., DUV wavelength at 248 nm, to form a twice exposed field within a column. For example, field 6 in the uppermost row is twice exposed, field 5 in the second row underlying the uppermost row is twice exposed, field 4 in the fourth row underlying the uppermost row is twice exposed, and field 3 in the fifth row underlying the uppermost row is twice exposed. These twice exposed fields are labeled 10-13 and can be at the nominal exposure dosage of the initial EUV exposure dosage or a multiple thereof since the mask only reflects the unintentional out-of-band radiation for the second pass exposure, wherein the net effect will be a small incremental addition to the first passage EUV dosage. For example, if the specified EUV dosage for the second pass exposure is 1× to 4× the initial exposure dosage for that field and the scanner is transmitting 1% out-of-band radiation along with the nominal 100%

EUV radiation, then the composite dose for the two passes will be 101%-104%. A comparison of the gray scale response of the twice exposed fields to the single exposed fields within the same column is then made to assess out-of-band dosage, which in the example given provides out-of-band radiation characterization associated with DUV wavelengths for the EUV exposure.

By way of example, analysis for an 1% out-of-band contribution from a 1× second pass dose is simulated in FIG. 9. The extra out-of-band dose at the sixth site (shown in top row 802 of FIG. 8) results in a disruption of the normally smooth gray scale response to the regular dose increments. The horizontal offset from the nominal curve corresponds to the magnitude of the out-of-band dose received.

Figure 10:
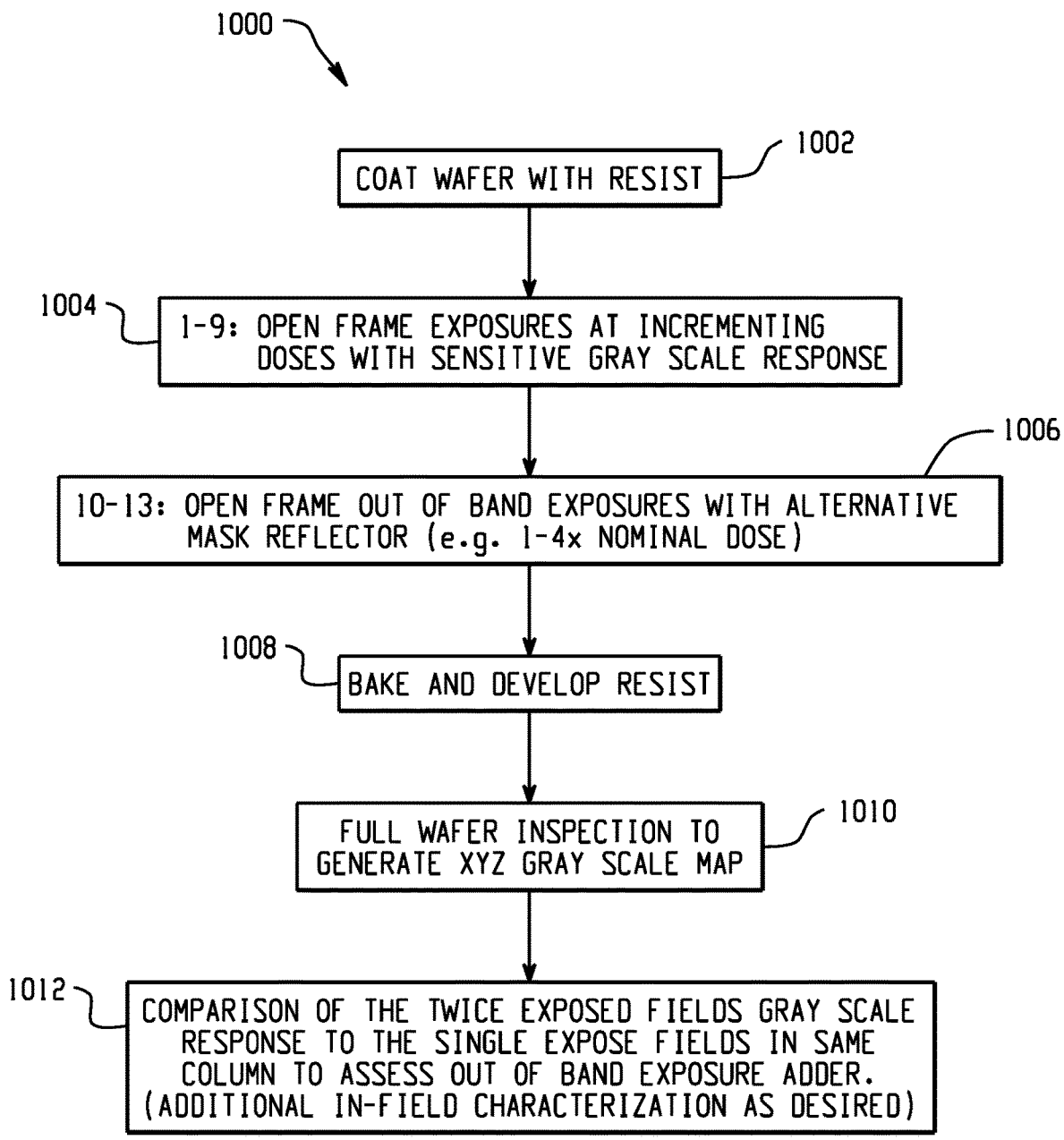
FIG. 10 is flow diagram illustrating a method for characterizing the out-of-band radiation in the exemplary scanner system according to one or more embodiments of the invention.

Turning now to FIG. 10, the method for out-of-band radiation characterization 1000 is depicted in the flow diagram. The flow diagram is merely exemplary and is not limited to the embodiments of the present invention presented herein. Method 1000 can be employed in many different embodiments or examples of the present invention not specifically depicted or described herein. In one or more embodiments, the procedures, processes, and/or activities of method 1000 can be performed in the order presented. In one or more embodiments of the present invention, one or more of the procedures, processes, and/or activities of method 1000 can be combined or skipped. In one or more embodiments of the present invention, method 1000 is performed by a processor as it is executing instructions and controlling an exemplary lithography tool.

In block 1002, a layer of photoresist is first uniformly coated on the wafer (i.e., substrate) prior to an open frame wafer exposure. No mask pattern is used when making the open frame wafer exposure, i.e., the mask is featureless. The photoresist is not intended to be limited and is generally selected to be photosensitive to the wavelength of radiation used for the out-of-band radiation characterization.

In block 1004, an open frame exposure is performed on the wafer at incrementally increasing doses within a given row to provide a sensitive gray scale response. Each additional row is exposed at the same incrementally increasing exposure doses.

In block 1006, open frame out-of-band radiation exposures are made with an alternative mask, which transmits light of different wavelengths due to the different reflector material employed as the alternative mask. The out-of-band radiation exposures can be at or greater than the nominal dose of the field associated with the prior open frame wafer exposure, e.g., 1 to 4× nominal exposure dose.

In block 1008, the resulting exposures to the photoresist produce dose dependent graded thickness blocks after post-exposure bake and develop steps.

In block 1010, full wafer inspection is done to generate an XYZ gray scale map by scanning the exposed and developed fields in a defect inspection tool that detects oblique light scattered from the substrate surface. The signal background levels or the noise detected during the defect inspection of the processed open frame wafer is sometimes referred to as a haze data. The "haze map" collects this noise data from a surface scan inspection of the entirety of the wafer. The haze map is converted to a grayscale pixel array. This can be performed in one of a variety of different manners. In one or more embodiments of the present invention, the gray scale pixel array can be output directly by the defect inspection tool. In one or more embodiments of the present invention, a high-resolution graphical image file of the wafer is output which contains the gray scale pixel details. In one or more embodiments of the present invention, multiple high-resolution images of the wafer are output by the defect inspection tool. In one or more embodiments of the present invention, the images are grayscale images.

In the image(s), the surface characteristics of a particular field represented in the pixel array as shades of gray. The brightness of the image at a point is related to the residual photoresist film properties (e.g. thickness, roughness, surface energy) at that point and thus is related to the exposure energy received. It should also be understood that color images can be created instead of grayscale images. In such a manner, the haze map is quickly transformed from into a graphical image that can then be analyzed using any one of a number of different graphic tools.

In block 1012, the pixel array can then be analyzed using one of a variety of different techniques. Because the array is now a graphic file in one of a variety of different formats (for example, jpeg, png, gif, bmp, tiff, and the like), a variety of different manners can be used to perform an analysis of the graphic file. For example, analysis software such as MATLAB can be used to analyze the uniformity of the graphic file. In one or more embodiments, a comparison of the twice exposed fields gray scale response to the single exposed field within the same column is made to assess out-of-band radiation distribution. The analysis can translate the graphic file into multiple two-dimensional graphs. Thereafter, the scanner energy consistency and uniformity within a field can be characterized. This enables better understanding of the scanner performance limitations and can be used to verify scanner optimization strategies.

Figure 11:
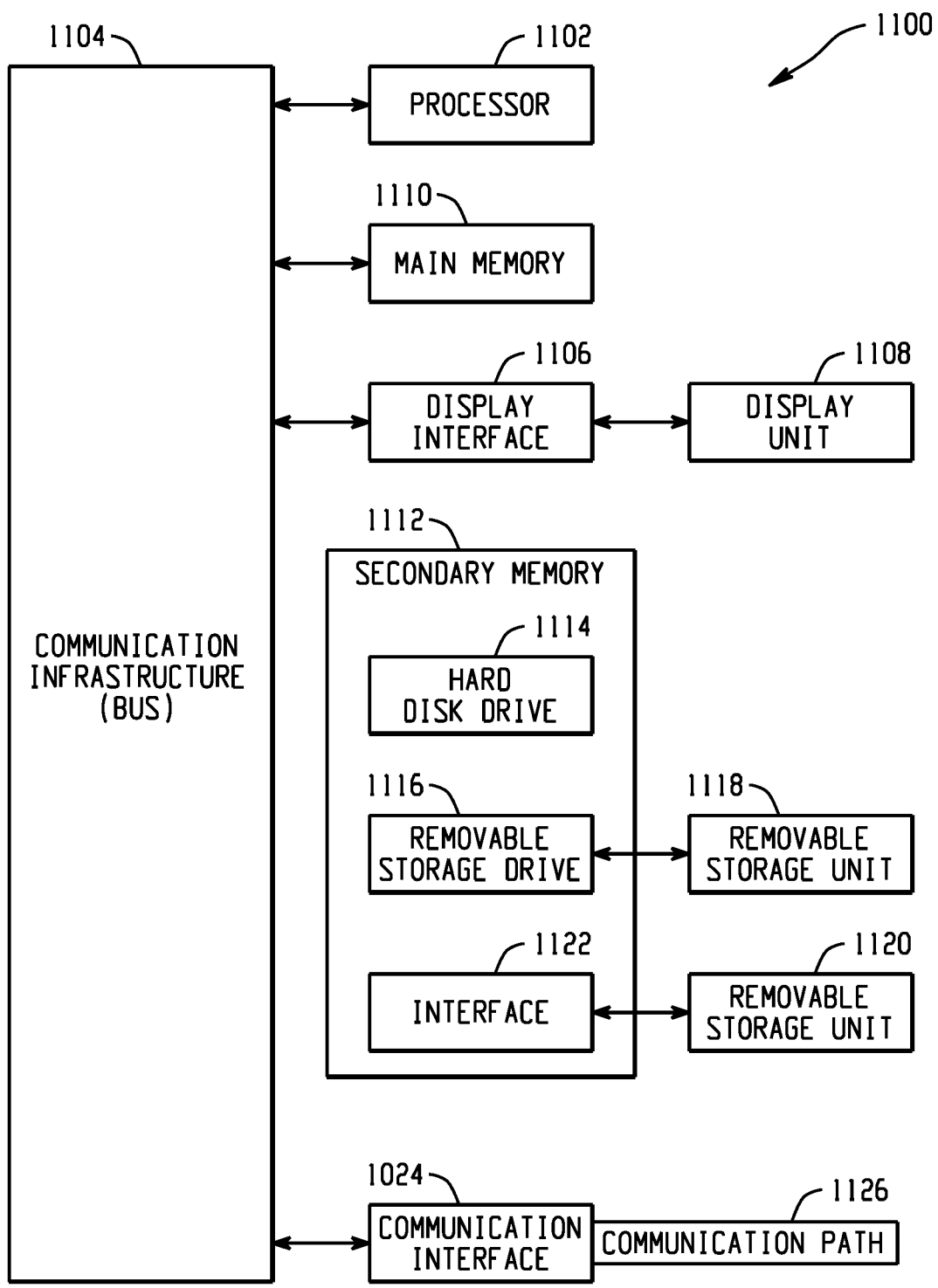
FIG. 11 is a block diagram of a computer system capable of performing one or more embodiments of the present invention.

FIG. 11 depicts a high-level block diagram of a computer system 1100, which can be used to implement all or part of one or more embodiments of the present invention. More specifically, computer system 1100 can be used to implement hardware components of systems capable of performing methods described herein. For example, computer system 1100 can be used to control a scanner or other lithography tool. Computer system 1100 can be used to perform analysis of a graphical image file created using one or more embodiments of the present invention. Although one exemplary computer system 1100 is shown, computer system 1100 includes a communication path 1126, which connects computer system 1100 to additional systems (not depicted) and can include one or more wide area networks (WANs) and/or local area networks (LANs) such as the Internet, intranet(s), and/or wireless communication network(s). Computer system 1100 and additional system are in communication via communication path 1126, e.g., to communicate data between them. Computer system 1100 can have one of a variety of different form factors, such as a desktop computer, a laptop computer, a tablet, an e-reader, a smartphone, a personal digital assistant (PDA), and the like.

Computer system 1100 includes one or more processors, such as processor 1102. Processor 1102 is connected to a communication infrastructure 1104 (e.g., a communications bus, cross-over bar, or network). Computer system 1100 can include a display interface 1106 that forwards graphics, textual content, and other data from communication infrastructure 1104 (or from a frame buffer not shown) for display on a display unit 1108. Computer system 1100 also includes a main memory 1110, random-access memory (RAM), and can include a secondary memory 1112. Secondary memory 1112 can include, for example, a hard disk drive 1114 and/or a removable storage drive 1116, representing, for example, a floppy disk drive, a magnetic tape drive, or an optical disc drive. Hard disk drive 1114 can be in the form of a solid-state drive (SSD), a traditional magnetic disk drive, or a hybrid of the two. There also can be more than one hard disk drive 1114 contained within secondary memory 1112. Removable storage drive 1116 reads from and/or writes to a removable storage unit 1118 in a manner well known to those having ordinary skill in the art. Removable storage unit 1118 represents, for example, a floppy disk, a compact disc, a magnetic tape, or an optical disc, etc. which is read by and written to by removable storage drive 1116. As will be appreciated, removable storage unit 1118 includes a computer-readable medium having stored therein computer software and/or data.

In alternative embodiments of the present invention, secondary memory 1112 can include other similar means for allowing computer programs or other instructions to be loaded into the computer system. Such means can include, for example, a removable storage unit 1120 and an interface 1122. Examples of such means can include a program package and package interface (such as that found in video game devices), a removable memory chip (such as an EPROM, secure digital card (SD card), compact flash card (CF card), universal serial bus (USB) memory, or PROM) and associated socket, and other removable storage units 1120 and interfaces 1122, which allow software and data to be transferred from the removable storage unit 1120 to computer system 1100.

Computer system 1100 can also include a communications interface 1124. Communications interface 1124 allows software and data to be transferred between the computer system and external devices. Examples of communications interface 1124 can include a modem, a network interface (such as an Ethernet card), a communications port, or a PC card slot and card, a universal serial bus port (USB), and the like. Software and data transferred via communications interface 1124 are in the form of signals that can be, for example, electronic, electromagnetic, optical, or other signals capable of being received by communications interface 1124. These signals are provided to communications interface 1124 via communication path (i.e., channel) 1126. Communication path 1126 carries signals and can be implemented using wire or cable, fiber optics, a phone line, a cellular phone link, an RF link, and/or other communications channels.

In the present description, the terms "computer program medium," "computer usable medium," and "computer-readable medium" are used to refer to media such as main memory 1110 and secondary memory 1112, removable storage drive 1116, and a hard disk installed in hard disk drive 1114. Computer programs (also called computer control logic) are stored in main memory 1110 and/or secondary memory 1112. Computer programs also can be received via communications interface 1124. Such computer programs, when run, enable the computer system to perform the features discussed herein. In particular, the computer programs, when run, enable processor 1102 to perform the features of the computer system. Accordingly, such computer programs represent controllers of the computer system. Thus, it can be seen from the foregoing detailed description that one or more embodiments of the present invention provide technical benefits and advantages.

Figure 12:
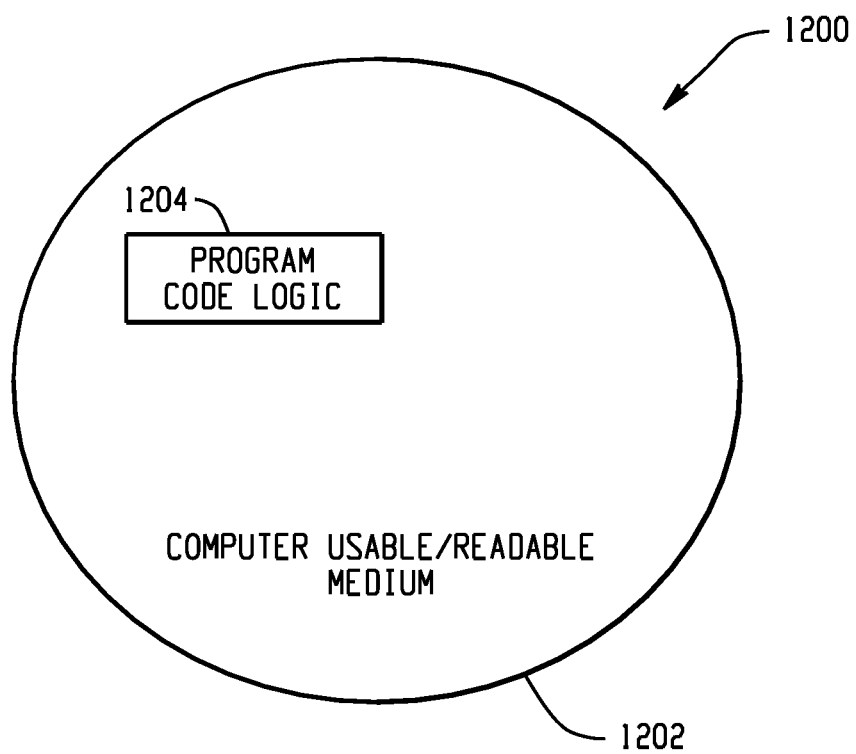
FIG. 12 is a block diagram of a computer program product capable of performing one or more embodiments of the present invention.

Referring now to FIG. 12, a computer program product 1200 in accordance with one or more embodiments of the present invention that include a computer-readable storage medium 1202 and program instructions 1204 is generally shown.

Embodiments of the present invention can be a system, a method, and/or a computer program product. The computer program product can include a computer-readable storage medium (or media) having computer-readable program instructions thereon for causing a processor to carry out aspects of embodiments of the present invention.

The computer-readable storage medium can be a tangible device that can retain and store instructions for use by an instruction execution device. The computer-readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out embodiments of the present invention can include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions can execute entirely on the consumer's computer, partly on the consumer's computer, as a stand-alone software package, partly on the consumer's computer and partly on a remote computer or entirely on the remote computer or server. In the latter scenario, the remote computer can be connected to the consumer's computer through any type of network, including a local area network (LAN) or a wide area network (WAN), or the connection can be made to an external computer (for example, through the Internet using an Internet Service Provider). In some embodiments of the present invention, electronic circuitry including, for example, programmable logic circuitry, field-programmable gate arrays (FPGA), or programmable logic arrays (PLA) can execute the computer-readable program instructions by utilizing state information of the computer-readable program instructions to personalize the electronic circuitry, in order to perform embodiments of the present invention.

Aspects of various embodiments of the present invention are described herein with reference to flowchart illustrations and/or block diagrams of methods, apparatus (systems), and computer program products according to various embodiments of the present invention. It will be understood that each block of the flowchart illustrations and/or block diagrams, and combinations of blocks in the flowchart illustrations and/or block diagrams, can be implemented by computer-readable program instructions.

These computer-readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions can also be stored in a computer-readable storage medium that can direct a computer, a programmable data processing apparatus, and/or other devices to function in a particular manner, such that the computer-readable storage medium having instructions stored therein includes an article of manufacture including instructions which implement aspects of the function/act specified in the flowchart and/or block diagram block or blocks.

The computer-readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description has been presented for purposes of illustration and description and is not intended to be exhaustive or limited to the form described. Many modifications and variations will be apparent to those of ordinary skill in the art without departing from the scope and spirit. The embodiments of the present invention described herein were chosen and described in order to best explain the principles of embodiments of the invention and the practical application, and to enable others of ordinary skill in the art to understand the various embodiments of the present invention with various modifications as are suited to the particular use contemplated.

What is claimed is:

1. A method for determining unintentional exposure dose delivered by a lithography tool, the method comprising:
    performing a series of open frame exposures with the lithography tool on a substrate having a photoresist therein to produce a primary array of controlled exposure dose blocks in photoresist, and embedding in the primary array one or more secondary exposure blocks of an alternative dosage or alternative dosages;
    baking and developing the exposed substrate;
    scanning the resultant open frame images with oblique light and capturing the light scattered from the substrate surface, using an oblique light inspection device;
    creating a haze map from a background signal of the captured scattered light data;
    converting the haze map to a graphical image file;
    analyzing the graphical image file, wherein the graphical image file is related to the effective dose of the lithography tool; and
    correlating any localized changes in the primary exposure array to the impact of secondary exposure blocks, wherein the localized changes characterize flare or out-of-band radiation contributed to the effective dose.

2. The method of claim 1 further comprising performing a series of open frame exposures with the lithography tool by utilizing a featureless mask.

3. The method of claim 1, wherein the open frame exposures are below a dose to clear (E0) the photoresist from the substrate.

4. The method of claim 1, wherein producing the primary array comprises performing the series of open frame exposures at equal exposure doses and producing the one or more secondary exposure blocks comprises performing additional open frame exposures at elevated exposure doses, wherein the open frame exposures in the primary array comprise open frame exposures immediately adjacent to the secondary exposure blocks.

5. The method of claim 1 further comprising performing gray scale calibration exposures at incrementally increasing exposure doses.

6. The method of claim 1, wherein correlating any localized changes in the effective dose of the primary exposure array to the impact of secondary exposure blocks comprises locally analyzing the open frame exposures in the primary array immediately adjacent to the secondary exposure blocks using the gray scale calibration to characterize an amount of the exposure dose associated with flare.

7. The method of claim 1, wherein producing the primary array of controlled exposure dose comprises performing the series of single open frame exposures at incrementally increasing doses using a mask transmissive at the nominal scanner wavelength, and producing the one or more secondary exposure blocks comprises exposing selected ones of the open frame exposures in the primary array a second time with an alternative mask reflector transmissive at a different wavelength, wherein the selected ones are at different exposure doses within the primary array.

8. The method of claim 7, wherein correlating any localized changes in the effective dose of the primary exposure array to the impact of secondary exposure blocks comprises comparing a gray scale response of the one or more secondary exposure blocks to the single open frame exposures in the primary array having an equal exposure dose as the selected ones of the open frame exposures for assessing the out-of-band radiation.

9. The method of claim 7, wherein the mask transmissive wavelength for performing the series of single open frame exposures is 13.5 nm and f producing the one or more secondary exposure blocks is at 248 nm.

10. A method for determining unintentional exposure dose associated with flare delivered by a lithography tool, the method comprising:

performing a series of open frame exposures with the lithography tool on a substrate having a photoresist thereon at equal exposure doses to produce a primary array of equal exposure dose blocks in the photoresist, and embedding in the primary array one or more secondary exposure blocks of an exposure dose greater than the equal exposure doses used to produce the primary array, wherein the open frame exposures in the primary array are immediately adjacent to the secondary exposure blocks;

performing dose-gray scale calibration exposures at incrementally increasing exposure doses;

baking and developing the exposed substrate;

scanning the resultant open frame images with oblique light and capturing the light scattered from the substrate surface, using an oblique light inspection device;

creating a haze map from a background signal of the captured scattered light data;

converting the haze map to a graphical image file;

analyzing the graphical image file, wherein the graphical image file is related to the effective dose provided by the lithography tool; and correlating any localized changes in the exposure dose blocks of the primary array immediately adjacent to the secondary blocks utilizing the dose-gray scale calibration to characterize the flare associated with the lithography tool.

11. The method of claim 10, wherein the open frame exposures in the primary array are below a dose to clear (E0) the photoresist from the substrate.

12. The method of claim 10, wherein the exposure dose of the one or more secondary exposure blocks is at least 5 times that of the equal exposure dose blocks used to produce the primary array.

13. The method of claim 10, wherein performing the series of the open frame exposures to define the primary array and the secondary blocks with the lithography tool utilizes a featureless mask.

14. The method of claim 10, further comprising embedding at least one exposure block in the primary array, wherein the at least one exposure block has no exposure.

15. The method of claim 10, wherein the localized changes are thickness changes subsequent to baking and developing the exposed substrate.

16. A method for determining unintentional exposure dose associated with out-of-band radiation delivered by a lithography tool, the method comprising:

performing a series of open frame exposures with the lithography tool on a substrate having a photoresist thereon at incrementally increasing doses to produce a primary array of single exposed fields, and embedding in the primary array one or more secondary exposure blocks by exposing selected ones of the open frame exposures in the primary array a second time with an alternative mask reflector transmissive at a different wavelength to form twice exposed fields within the primary array;

baking and developing the exposed substrate;

scanning the resultant open frame images with oblique light and capturing the light scattered from the substrate surface using an oblique light inspection device;

creating a haze map from a background signal of the captured scattered light data;

converting the haze map to a graphical image file;

analyzing the graphical image file, wherein the graphical image file is related to the effective dose of the lithography tool; and comparing a gray scale response of the twice exposed fields to the single exposed fields to characterize the out-of-band radiation associated with the lithography tool.

17. The method of claim 16, wherein the mask transmissive wavelength for producing the single exposed fields is 13.5 nm and the mask transmissive wavelength for producing the twice exposed fields is 248 nm.

18. The method of claim 16, wherein the open frame exposures in the primary array are below a dose to clear (E0) the photoresist from the substrate.

19. The method of claim 16, wherein the single exposed field are arranged in columns and rows.

20. The method of claim 16, wherein performing the series of the open frame exposures to define the primary array and the secondary blocks with the lithography tool utilizes a featureless mask.

\* \* \* \* \*